United States Patent
Lin et al.

(10) Patent No.: US 9,147,027 B2
(45) Date of Patent: Sep. 29, 2015

(54) CHIP CROSS-SECTION IDENTIFICATION AND RENDERING DURING FAILURE ANALYSIS

(71) Applicant: Synopsys, Inc., Mountain View, CA (US)

(72) Inventors: Xi-Wei Lin, Fremont, CA (US); Ankush Oberai, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 14/318,552

(22) Filed: Jun. 27, 2014

(65) Prior Publication Data

US 2015/0007121 A1    Jan. 1, 2015

Related U.S. Application Data

(60) Provisional application No. 61/841,288, filed on Jun. 29, 2013.

(51) Int. Cl.
*G06F 17/50* (2006.01)

(52) U.S. Cl.
CPC .................................. *G06F 17/5068* (2013.01)

(58) Field of Classification Search
CPC ..... G06F 17/30; G06F 17/50; G01N 21/9501; H01L 2924/0002; H01L 22/12
USPC .............. 716/112, 42, 54, 55; 703/13; 702/81
See application file for complete search history.

(56) References Cited

U.S. PATENT DOCUMENTS

| | | | |
|---|---|---|---|
| 6,275,971 B1 | 8/2001 | Levy | |
| 6,969,837 B2 | 11/2005 | Ye | |
| 7,131,076 B2 * | 10/2006 | Sherstyuk et al. | 716/111 |
| 7,149,989 B2 | 12/2006 | Lakshmanan et al. | |
| 7,792,595 B1 * | 9/2010 | Bomholt et al. | 700/29 |
| 7,847,937 B1 | 12/2010 | Bevis | |
| 7,873,204 B2 | 1/2011 | Wihl et al. | |
| 7,873,585 B2 | 1/2011 | Izikson | |
| 2005/0113951 A1 * | 5/2005 | Akiyama et al. | 700/97 |
| 2009/0287440 A1 | 11/2009 | Kulkarni | |
| 2009/0310870 A1 | 12/2009 | Monkowski | |
| 2010/0238433 A1 | 9/2010 | Lange et al. | |
| 2012/0036405 A1 * | 2/2012 | Iizuka | 714/723 |
| 2012/0316855 A1 * | 12/2012 | Park et al. | 703/13 |

* cited by examiner

*Primary Examiner* — Mohammed Alam
(74) *Attorney, Agent, or Firm* — Adams Intellex, PLC

(57) ABSTRACT

A defective integrated circuit (IC) is analyzed to identify a portion of the integrated circuit possibly containing an electrical defect. A computer is used to process the design information of the integrated circuit and to navigate to the physical portion of the integrated circuit where potential electrical defect might be found. The design information includes information on the layout and the technology used to fabricate the integrated circuit. A three-dimensional view of the portion of the design of integrated circuit where the electrical defect might be found is rendered, based on the design information for the integrated circuit.

31 Claims, 8 Drawing Sheets

CHIP CROSS-SECTION IDENTIFICATION AND RENDERING DURING FAILURE ANALYSIS

RELATED APPLICATIONS

This application claims the benefit of U.S. provisional patent application "Chip Cross-Section Identification and Rendering During Failure Analysis" Ser. No. 61/841,288, filed Jun. 29, 2013. The foregoing application is hereby incorporated by reference in its entirety.

FIELD OF ART

This application relates generally to semiconductor failure analysis and more particularly to failure analysis using three-dimensional renderings.

BACKGROUND

Integrated circuit design and fabrication is a vastly complex effort and involves designers managing interaction between numerous steps in a manufacturing process. To effectively handle the steps in the design process, designers must understand the limitations of the manufacturing process. Shapes must be designed which can be fabricated in a manner that allows for the implementation of desired electronic circuit function at the resulting end of fabrication. Frequently, millions and even hundreds of millions of transistors can exist on a single semiconductor chip. Each transistor is composed of shapes for diffusion, polysilicon, contacts, and metallization, along with other structures. The ability to design chips with such large numbers of essential transistors can be quite challenging, and circuit optimization can prove a daunting task, even with the help of electronic design automation (EDA) software tools.

Numerous metal lines of miniscule dimension lie in close proximity to one another on each semiconductor chip. Further, diffusions, polysilicon shapes, and insulator layers share space on the chip, and must be fabricated to exacting tolerances. As technologies have advanced, the lithographic process used to fabricate these structures uses smaller and smaller dimensions. These smaller dimensions allow for more structures on a chip, but also allow even small defects to have a greater impact. A defect can impact a circuit in many ways. For example, a defect may bridge between two structures, thereby causing a short or resistive short. In some cases, a defect may even increase capacitance between adjacent structures. Defects can enter a semiconductor chip at each step in the fabrication process. No amount of effort will ever completely eliminate defects from the manufacturing process. Further, failures on semiconductor chips may be the result of random defects or systematic defects on the chips.

Failure analysis (FA) of an integrated circuit (IC) may involve preparing samples by cutting though silicon at a precise location and depth, and then examining each sample using optical microscopy, scanning electron microscopy (SEM), transmission electron microscopy (TEM), or some other inspection method. Before the integrated circuit under evaluation is cut, it may be valuable to examine the surface of the integrated circuit to help determine the place to cut, and/or to look for visible defects on the surface. Using layout-driven navigation software it is possible to drive a machine to locate an area of interest of the integrated circuit and examine the surface of the integrated circuit, but, short of cutting into the integrated circuit, the structure and materials beneath the area are often unknown to failure analysis engineers. Because of the difficulty of determining what is below a specific area on the surface of the integrated circuit, identifying areas of interest using surface examination is an error prone venture, which may result in mistakes in identifying the actual area of interest and delays in the failure analysis process. Actually cutting the integrated circuit is a destructive process; thus, cutting into the integrated circuit in the wrong location may destroy the area with the defect, rendering any attempt to diagnose the defect in the particular integrated circuit impossible.

SUMMARY

A defective integrated circuit (IC) is analyzed to identify a portion of the integrated circuit where an electrical defect might be found. A computer is used to process the design information of the integrated circuit and to navigate to the physical portion of the integrated circuit where the potential electrical defect might be found. The design information includes information on the layout and the technology used to fabricate the integrated circuit. A three-dimensional view of the portion of the design of integrated circuit where the electrical defect might be found is also rendered, based on the design information of the integrated circuit. A computer-implemented method for circuit failure analysis is disclosed comprising: identifying a physical portion of a physical chip to be failure analyzed; rendering a three-dimensional view of the physical portion that was identified; and navigating to the physical portion of the physical chip.

The identifying of the physical portion can be based on electrically analyzing the physical chip which identifies a failure in operation. Various renderings are possible, corresponding to the physical chip. A three-dimensional view can be rotated to aid in further understanding of the physical chip and any defects that reside on the chip. The rendering may include generating a cut through a cross section of the three-dimensional view. Navigation may be accomplished using layout driven chip navigation software with navigation to a location corresponding to the rendering.

In embodiments, a computer system for circuit failure analysis comprises: a memory which stores instructions; one or more processors coupled to the memory wherein the one or more processors are configured to: identify a physical portion of a physical chip to be failure analyzed; render a three-dimensional view of the physical portion that was identified; and navigate to the physical portion of the physical chip. In some embodiments, a computer program product embodied in a non-transitory computer readable medium for circuit failure analysis comprises: code for identifying a physical portion of a physical chip to be failure analyzed; code for rendering a three-dimensional view of the physical portion that was identified; and code for navigating to the physical portion of the physical chip. Various features, aspects, and advantages of various embodiments will become more apparent from the following further description.

BRIEF DESCRIPTION OF THE DRAWINGS

The following detailed description of certain embodiments may be understood by reference to the following figures wherein.

DETAILED DESCRIPTION

Figure 1:
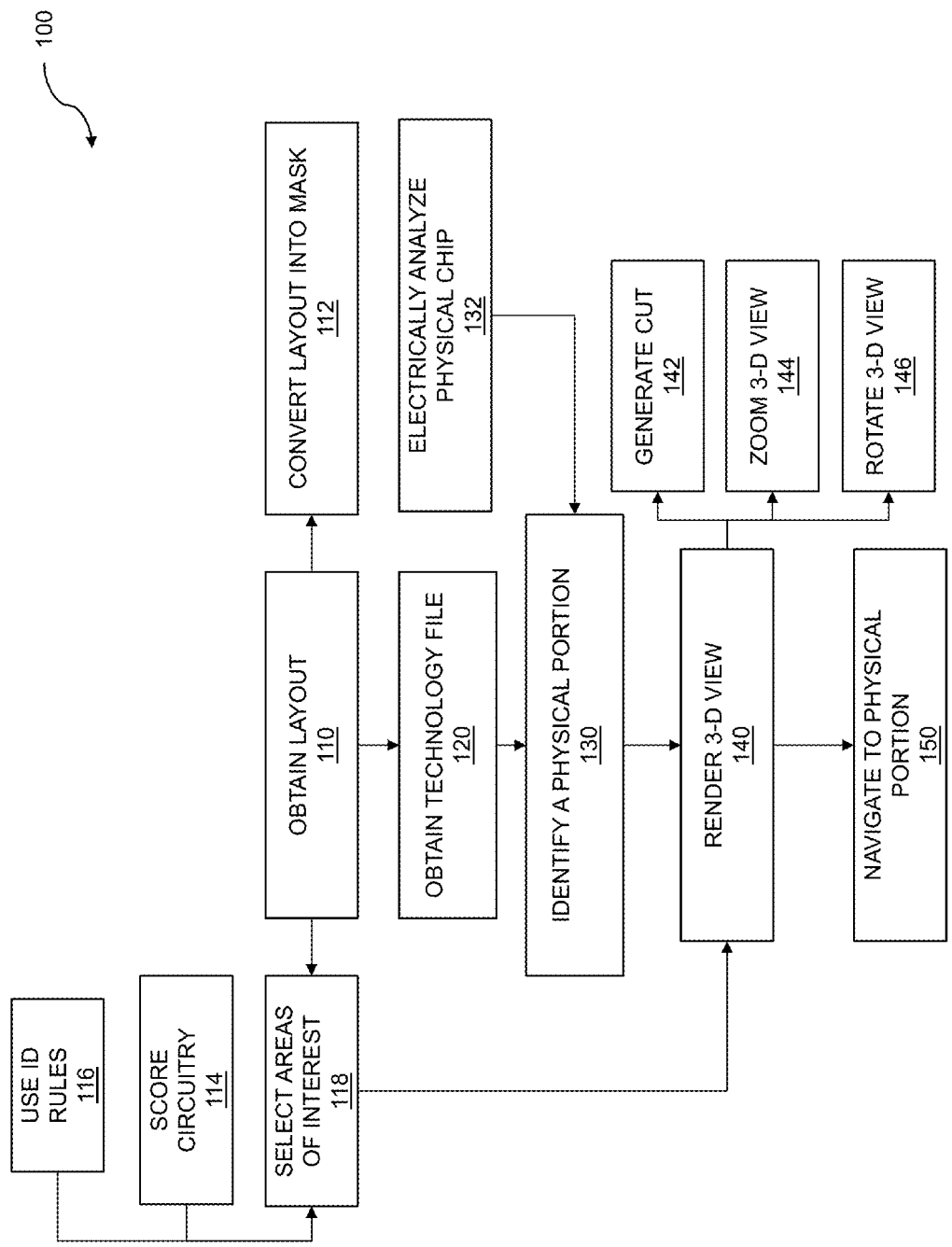
FIG. 1 is a flow diagram for chip cross-section identification and rendering.

Integrated circuits (ICs) may become nonoperational due to defects introduced during the fabrication process, or due to events that occur after the integrated circuit is fabricated. It can be useful to analyze a defective integrated circuit to determine the cause of failure. In some embodiments, an integrated circuit may be analyzed for a variety of reasons, such as to establish a baseline, even if the integrated circuit is not suspected of being defective. Design information can be obtained about an integrated circuit has been identified for analysis. The design information may include information about the layout, such as mask information for various layers and information about the fabrication of the integrated circuit; for example, information about each layer, information about materials used in each layer, minimum feature dimensions of each layer, and the thickness of each layer, as non-limiting examples. In some embodiments, the design information may include definitions of electronic devices and their association with various elements of the layout. Example electronic devices can include transistor, logic gates, and functional blocks.

A portion of interest in the integrated circuit can be identified. The portion may be identified based on having the potential for a defect. The portion of interest in the integrated circuit may include a design portion that identifies a portion of the design information about the integrated circuit and a physical portion of the physical integrated circuit that corresponds to the design portion. The portion may be identified based on the behavior exhibited by the defective physical integrated circuit, some aspect of the manufacturing process used to fabricate the integrated circuit, a known or suspected issue with a mask used to manufacture the physical integrated circuit, an electrical analysis of the physical integrated circuit, and/or any other method of identifying a portion of the integrated circuit. In some embodiments, a simulation of a defect in a computer model of the integrated circuit can be compared to the electrical analysis of the physical integrated circuit to identify the portion of the integrated circuit. In some embodiments, the portion of the integrated circuit can be identified in a report, a computer file, a user input, a message, or other means. In at least one embodiment, the portion of interest can be identified by a user at a failure analysis workstation by identifying a physical location, such as an X, Y coordinate, of the physical integrated circuit or by identifying a logical element in the design information, such as a particular electronic device in the design information.

Once the portion of interest has been identified, a tester can be navigated to the physical portion on the integrated circuit. Navigating to the physical portion may involve positioning the integrated circuit so that the physical portion is viewable and/or accessible by some type of analysis device. The analysis device may be an optical microscope, a scanning electron microscope, a transmission electronic microscope, a physical probing system, an electron beam probing system, a focused ion beam system, a cross-sectioning system, or any other type of device for viewing, drilling, cutting, etching, probing, stimulating, or manipulating a portion of the integrated circuit, either electrically or physically. The integrated circuit may be positioned at a failure analysis station, which may be navigated to focus on the physical portion of interest on the integrated circuit.

Once the portion of interest has been identified, the design portion is rendered as a three-dimensional (3D) image. The three-dimensional image may be displayed to a user who also has access to the information generated by the failure analysis station. Information—such as a micrograph—generated by the failure analysis station, along with the three-dimensional rendering of the same portion of the integrated circuit, may both be readily available, and in some embodiments, can be simultaneously available—for example, simultaneously displayed on the same monitor. The efficiency and effectiveness of failure analysis can be improved by augmenting navigation software that navigates to a physical portion of an integrated circuit with a three-dimensional visualization of the corresponding design portion of the integrated circuit in real time. With three-dimensional structural and physical views readily available for an area of interest, virtual cuts in cross-section can be performed, and three-dimensional renderings of the virtual cuts used to select a precise location to show the desired features before committing physical cuts using techniques such as focused ion beam (FIB). Allowing such virtual analysis before the physical analysis can minimize guess work and potential impactful mistakes. For example, because of the destructive nature of physical cuts, physically cutting an integrated circuit in the wrong location can actually destroy evidence of a defect.

FIG. 1 is a flow diagram for chip cross-section identification and rendering. The flow 100 comprises a computer-implemented method for circuit failure analysis. The flow 100 includes obtaining a layout 110 for a semiconductor chip design. The layout may be obtained by reading one or more computer files from computer storage media, by using a logical design to generate a physical design layout, by user input, by receiving a communication over a communications link, by scanning images of masks for various layers of the design, or by any other method. The layout may include information about various layers of the chip, and/or masks used in various process steps of the chip's fabrication process. In some embodiments, the layout may include graphic data system II (GDSII) data. The flow 100 may further comprise converting the layout into a mask view 112 for the semiconductor chip design. The mask view may include geometric shapes of materials for the various layers of material in the chip.

The flow 100 can comprise selecting areas of interest 118 on the layout of the semiconductor chip design. One or more areas of interest can be identified. In some embodiments, the areas of interest is based on the electrical analyzing of the physical chip, and the electrical analyzing may identify a failure in operation of the chip. In some embodiments, the areas of interest are identified as those areas of the chip where a defect has the potential to cause the chip to exhibit behavior detected by the electrical analysis. Further, the areas of interest may be generated based on scoring of circuitry 114. Debug analysis may evaluate a cone of logic and possible failure sites, and provide a score for each site. A score may represent a likelihood or probability that a given circuit is the site of the failure. The scores can then be used to identify the areas of interest. In some embodiments, the areas of interest can be generated using one or more rules 116 implemented to identify layout spots. The rules may be based on design rules for the various layers, such as minimum feature dimensions and/or spacing. The one or more rules may be defined to identify potentially troublesome locations in the layout, such as where design rules are violated, or specific areas on the layout where dimensions are at or near the minimum allowable dimension. In some embodiments, specific shapes may be identified by the rules, such as a certain shape widths and spacings.

The flow 100 includes obtaining a technology file 120 for a specific semiconductor chip's fabrication process—the process through which a semiconductor chip design is transformed into a physical chip. The technology file may be obtained by reading one or more computer files from computer storage media, by user entry, by receiving a communication over a communications link, or by any other method. The technology file includes information about the fabrication process used to manufacture the chip. Depending on the fabrication process, the technology file may include information about one or more layers of the manufactured chip, materials used, dimensions of the materials, spacing between features, thickness of a layer, or other aspects about the processing and resulting dimensions.

The flow 100 includes identifying a physical portion of the physical chip 130 for failure analysis. The physical portion of the physical chip may be selected based on the one or more areas of interest. In at least one embodiment, one area of interest is identified and the physical portion of the physical chip is selected to correspond to the identified area of interest. The flow 100 may also include electrically analyzing the physical chip 132 to identify a physical portion of the physical chip to be failure analyzed. So, the identifying of the physical portion may be based on an electrical analysis of the physical chip. The physical portion is identified by an operator at a failure analysis station, in some embodiments. The physical portion may be of any shape, but is rectangular in at least some embodiments. The physical portion may be specified using one or more two-dimensional (2D) coordinates on the surface of the chip that may be referenced to a corner of the chip, the center of the chip, or a reference marker on the chip. In some embodiments, the physical portion is specified by a single two-dimensional coordinate and a size and shape, where the size and/or shape may be either implicitly or explicitly specified. In at least one embodiment, the physical portion is specified by two two-dimensional coordinates that identify opposite corners of a rectangular physical portion. The physical portion may also include one or more layers of interest which may be specified by a layer number or a physical dimension. Specifying across one or more layers means that, in some embodiments, the physical portion is specified using one or more three-dimensional coordinates.

The flow 100 comprises rendering a three-dimensional view 140 of a design portion of the semiconductor chip design based on the layout and the technology file, wherein the design portion corresponds to the physical portion. The rendering may include a two-dimensional isometric projection view or two-dimensional perspective view. In some embodiments, stereoscopy or other three-dimensional imaging technologies may be used to create a true three-dimensional view. The rendering may be done so that certain materials, such as insulating material and or layers, are left out of the rendering, or rendered completely transparent, to allow the details of the circuit elements to be seen. Some materials or layers may be rendered with different levels of transparency, to allow circuit details to be shown even if they are obscured by other features. In some embodiments, the three-dimensional rendering will be represented as a monochrome image, but other embodiments may render a color image. The different materials and/or layers can be represented with different colors and/or intensities in some embodiments.

The rendering can include generating a cut 142 through the cross section of the three-dimensional view. One or more cuts may be generated through the three dimensional view and may have any orientation. In at least one embodiment, one cut is generated on a plane perpendicular to the surface of the chip and parallel with one edge of the chip, and is represented in the three-dimensional view. The flow 100 may further comprise zooming of the three-dimensional view 144. The flow 100 may further comprise rotating the three-dimensional view 146. The zooming and rotating of the three-dimensional view can be under control of a user to allow the user to envision the structure of the chip.

The flow 100 comprises navigating to the physical portion 150 of the physical chip, wherein the design portion was three-dimensionally rendered. The navigation may be done to position the physical chip in a way which allows the physical portion to be viewed through a microscope, and/or to position the chip in a way which allows a focused ion beam to physically make a cut in the physical chip. So, the navigating may include moving a probing location to the portion of the physical chip. The navigating may physically move the chip, but may also change the portion of the chip that may be viewed and/or manipulated. The navigating can be done at a failure analysis workstation, in some embodiments. Various steps in the flow 100 may be changed in order, repeated, omitted, or the like without departing from the disclosed concepts. Various embodiments of the flow 100 may be included in a computer program product embodied in a non-transitory computer readable medium that includes code executable by one or more processors.

Figure 2:
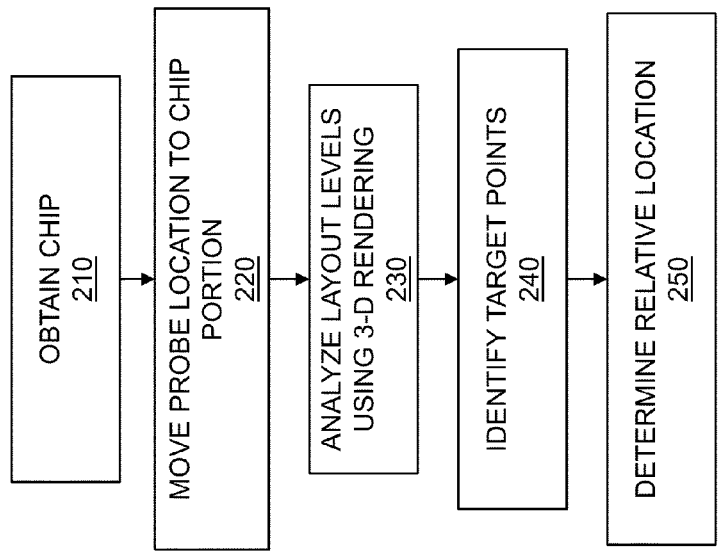
FIG. 2 is a flow diagram for chip navigating.

FIG. 2 is a flow diagram for chip navigating. The flow 200 includes obtaining a chip 210, which may also be referred to as an integrated circuit (integrated circuit), a semiconductor chip, an integrated electronic circuit, or by simply using the term circuitry. The chip may be obtained based on a sampling program that can be determined based on previous analyses of chips using both three-dimensional rendering of portion of the chip and navigating to a corresponding portion on a physical chip. The flow 200 continues by moving a probe location to a chip portion 220, a process which also can be called navigating to the chip portion. A microscope and probe location may comprise the viewing area of the microscope, a focused ion beam, a physical probe's location the probe touches the chip, and an electron beam probe's probe location may be where the electron beam impacts the chip. The navigating may be accomplished using layout driven chip navigation software.

The navigating may further comprise analyzing a plurality of layout levels 230 within the layout to determine target points on the layout, identifying those target points 240 on the physical chip, and determining the relative location of the portion to one or more of the target points 250. A target point on the layout can be a functional block, a logic gate, a transistor or other electronic component, a conductor, or any structure identified on any layer of the layout. In some embodiments, the target points can be determined based on an electrical analysis, failure probability analysis, scoring, one or more design rules, or by any other method. Once the target points have been determined, the corresponding physical location of the target point can be identified on the physical chip. In some embodiments, the location of a target point can be identified by a two-dimensional coordinate, and a layer number may be included along with the location. In other embodiments, a three-dimensional coordinate can be used to identify a target point. In yet other embodiments, multiple coordinates are used to identify a target point. Once the location of the target points on the physical chip has been identified, their location with respect to the portion of the physical chip can be determined. The portion of the physical chip may be changed to include one or more of the target points, accompanied by, in some embodiments, navigation to the new portion. Various steps in the flow 200 may be changed in order, repeated, omitted, or the like without departing from the disclosed concepts. Various embodiments of the flow 200 may be included in a computer program product embodied in a non-transitory computer readable medium that includes code executable by one or more processors.

Figure 3:
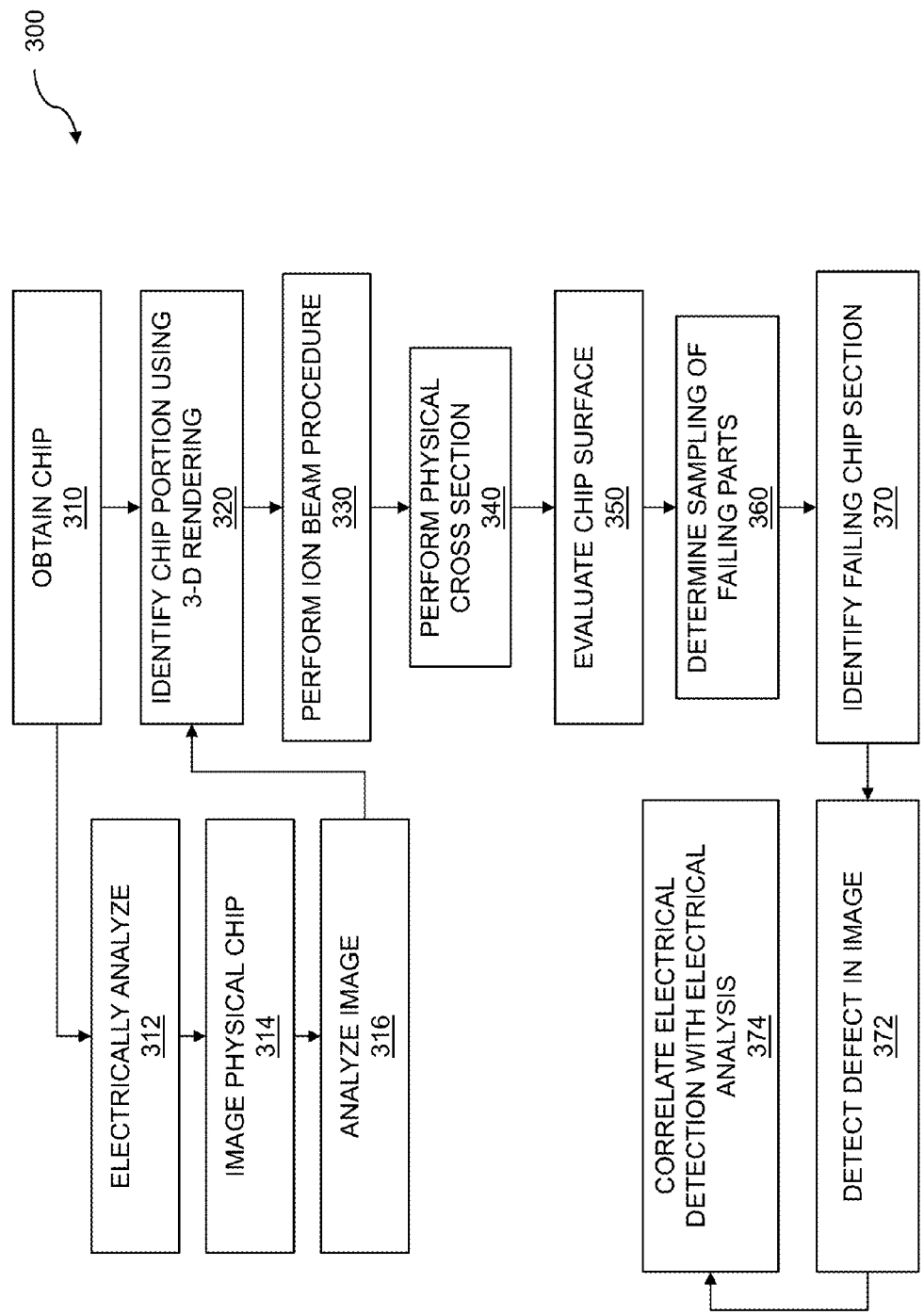
FIG. 3 is a flow diagram for chip failure analysis.

FIG. 3 is a flow diagram for chip failure analysis. The flow 300 includes obtaining a chip 310 for failure analysis. The chip may be obtained based on detection of a chip failure, based on the findings of a sampling program, or for any other reason. Design information about the chip may also be obtained. The chip may be electrically analyzed 312 to determine failure symptoms. In some embodiments, the electrical analysis may be used to predict where a defect may have occurred. In some embodiments, one or more areas of interest may be identified based on the electrical analysis. The physical chip may be imaged 314. Depending on the embodiment, the entire chip can be imaged, or one or more the areas of interest can be imaged. The imaging may be done using any method or type of equipment, including, but not limited to, optical imaging, electron beam imaging, focused ion beam imaging, or x-ray imaging.

A portion of the chip may be selected for analysis. The portion is based on one or more of the areas of interest, in some embodiments. The flow 300 may include analyzing the failure using imaging 316 performed on the physical chip. A design portion may be identified which corresponds to the portion of the chip selected for analysis. A three-dimensional image of the design portion may be rendered to show the three-dimensional structure of the chip portion. Various virtual cuts in the three-dimensional image can be made and a new rendering may be produced in order to show different parts of the three-dimensional structure of the portion. A virtual cut showing a theorized defect may be determined and may be used to identify a chip portion for further analysis. Thus, the flow 300 includes identifying a chip portion using three-dimensional rendering 320.

The flow 300 may further comprise performing a focused ion beam procedure 330 on the physical chip in a location corresponding to the identified portion. The location of the focused ion beam procedure may be determined based on the virtual cuts made in the three-dimensional rendering. A physical cross-section 340 of the physical chip corresponding to the identified portion may be performed. The process of performing a physical cross-section creates a new surface on the physical chip, and the flow 300 may further comprise evaluating the existing or the newly created surface of the physical chip 350 to access matching with the identified portion of the layout. The flow 300 may further comprise determining sampling of failing parts 360 based on failure analysis using the rendering. The sampling may be used to select other chips for failure analysis from the same manufacturing lot as the first chip analyzed, or from other manufacturing lots. The flow 300 may further comprise identifying a failing section of the physical chip 370 where the failing section includes the portion of the semiconductor chip. The failing section may be determined, at least in part, by the examination of the chip cross-section surface created by the ion beam procedure.

Figure 4:
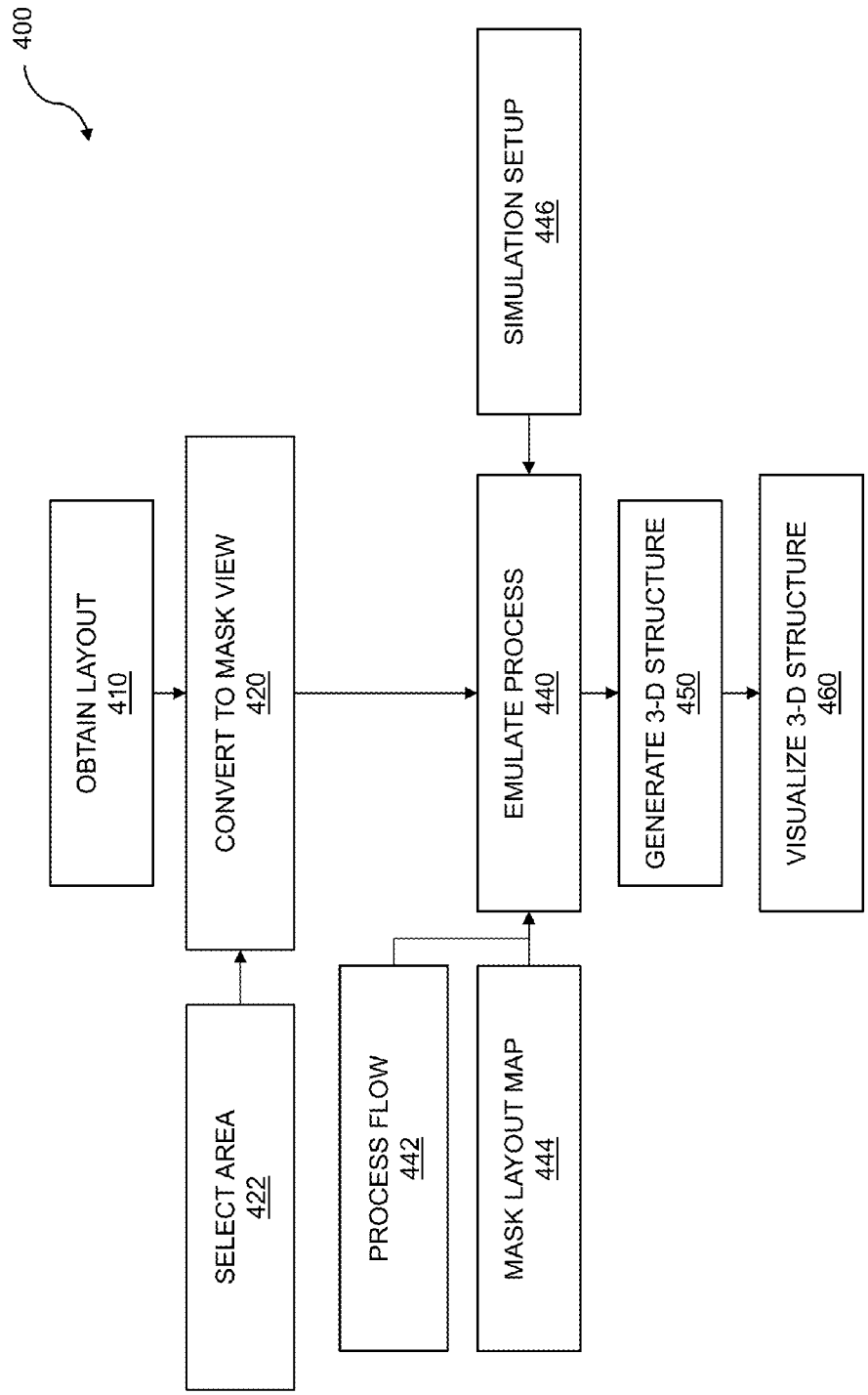
FIG. 4 is a flow diagram for 3-D visualization.

An image of the surface of the physical chip may be compared with the virtual cut made in the three-dimensional rendering of the portion of the layout to identify a defect in the physical chip. So, the flow 300 may further comprise detecting a defect in the image 372 of the physical chip in the portion. The image may be based on optical imaging, electron beam imaging, or focused ion beam imaging, among other techniques. The flow 300 may further comprise correlating the defect in the image with an electrical analysis 374 for a net list of the semiconductor chip design with a defect inserted. The defect in the image may be analyzed to determine an equivalent electrical defect in the design. So, for example, if the image shows that two conductors are touching where they should be isolated, an electrical short between the two corresponding nodes in the logical design may be an equivalent electrical defect. The design may have the defect added, and a simulation may be run on the design, which may be a type of electrical analysis for the net list. The results of the simulation may be compared to the results of the electrical analysis of the physical chip to determine if the defect observed in the image could account for the behavior of the chip that was observed in the electrical analysis of the physical chip. Various steps in the flow 300 may be changed in order, repeated, omitted, or the like without departing from the disclosed concepts. Various embodiments of the flow 300 may be included in a computer program product embodied in a non-transitory computer readable medium that includes code executable by one or more processors, FIG. 4 is a flow diagram for 3-D visualization. The flow 400 includes obtaining a layout 410. The layout may be obtained by reading one or more computer files from computer storage media, by using a logical design to generate a physical design layout, by user entry, by receiving a communication over a communications link, by scanning images of masks for various layers of the design, or by any other method. The layout may include information about various layers of the chip, and/or masks used for various process steps of the fabrication process used to manufacture the chip. In some embodiments, the layout may include graphic data system II (GDSII) data. The flow 400 includes converting the layout into a mask view 420 for the semiconductor chip design. The mask view may include geometric shapes for various process steps during fabrication of the chip. The flow 400 may include selecting one or more areas of interest 422 on the layout of the semiconductor chip design. In some embodiments, the areas of interest are identified as areas of the chip where a defect in a corresponding physical chip is suspected.

The flow 400 continues by emulating the process 440 of manufacturing a chip based on the mask view. A technology file containing data regarding a fabrication process through which a semiconductor chip design may be fabricated from the mask view, and/or other information on how the mask view is used to fabricate a chip, may be obtained. A process flow 442 containing information on how to emulate the chip processing may be included in the technology file. A mask layout map 444 indicating how the various masks of the mask view are used in the various fabrication steps may also be included in the technology file. The process flow may describe the various steps of the fabrication process, including how the various steps may interact with the masks and how the various steps contribute to the structures of the final chip. For example, the process flow may describe steps where a layer of metal of a defined thickness is deposited over the entire chip, followed by applying a layer of photoresist material. A particular mask may then be placed over the photoresist layer, exposing designs in the photoresist layer. Another step may then remove the exposed photoresist, followed by an etching step to remove the exposed metal. The remaining photoresist may then be removed to leave metal structures of the defined thickness that generally match the shapes of the shaped of the mask used.

A simulation setup 446 may be used to define how to simulate the various steps of the process flow in order to generate three-dimensional structures which closely match the results of the actual physical processes. The overall fabrication process may be emulated to determine what actual structure would be included in the manufactured chip, and what shape, thickness, and relative locations, the various structures would have. The type of material from which the structure is made may also be identified for the various structures. For example, some masks may be used to create a pattern in material which is included in the final chip, such as a rectangular metal conductor on a particular layer. Other masks may be used for process steps that may not result in material in the final chip, but may still have an impact on the shape, thickness, or other properties of material which is included in the final chip. An example of such a mask may be a mask to etch away a sacrificial material that is used in an intermediate process step. In other cases, various process steps may change the shapes, thicknesses, dimensions, or other properties of various structures so that the structures no longer match the shapes defined in the mask layers. An example of this is a process step that can etch away the sides of a structure, making the structure smaller, which, as an example, might narrow the width of a conductor.

The emulation of the process may be used to generate a three-dimensional structure 450. The emulation may be referred to as a three-dimensional simulation. The structures simulated may include full process layers, including such structures as a nitride spacer around poly, oxide and low k dielectric materials, and contact and metal layers. The shapes of the various structure may be simulated using the information in the layout, the technology file, and the simulation setup in order to closely emulate the shapes generated by actual fabrication processes. The three-dimensional structure may be generated for a subset of the layout, such as for one or more of the areas of interest, although other embodiments may generate the three-dimensional structure for the entire layout. The three-dimensional structure may include various three-dimensional objects that may be tagged or otherwise identified by the type of material from which the three-dimensional-rendered object is constructed in the manufactured chip. The three-dimensional structure may include a position of each of the three-dimensional objects, so that, if the three-dimensional objects were assembled, they would represent the inner structure of a chip that might be manufactured from the layout contained within the technology file. The three-dimensional structure may be a three-dimensional simulation of the internal structure of the chip.

After at least some of the three-dimensional structure has been generated, one or more views of the three-dimensional structure can be rendered using any known three-dimensional rendering technique. In some embodiments, the rendering can be done for an area of interest. In some embodiments, the rendering can be performed for a subset of the three-dimensional objects within the area of interest. In at least one embodiment, three-dimensional objects made with silicon oxide are removed—i.e. not rendered—or rendered as fully transparent. In some embodiments, hidden lines are removed, but in other embodiments, hidden lines remain visible. In some embodiments, the rendering can be done in monochrome, but other embodiments might use color to represent the various layers and/or different materials. So the rendering can be based on a three-dimensional simulation that includes structural generation. Various views of the three-dimensional structure may be generated to help a user visualize the three-dimensional structure 460. In some embodiments, the user can be able to control rotation, zoom, the removal of various three-dimensional objects, the addition and/or removal of cut planes, and other parameters of the rendering in real-time to more effectively visualize the three-dimensional structure. The three-dimensional rendering may be a two-dimensional isometric or perspective view of the three-dimensional structure, a stereoscopic rendering or holographic rendering of the three-dimensional objects to allow a user to get a true three-dimensional view of the structure, or any other type of rendering which allows a three-dimensional structure to be visualized. Various steps in the flow 400 may be changed in order, repeated, omitted, or the like without departing from the disclosed concepts. Various embodiments of the flow 400 may be included in a computer program product embodied in a non-transitory computer readable medium that includes code executable by one or more processors.

Figure 5:
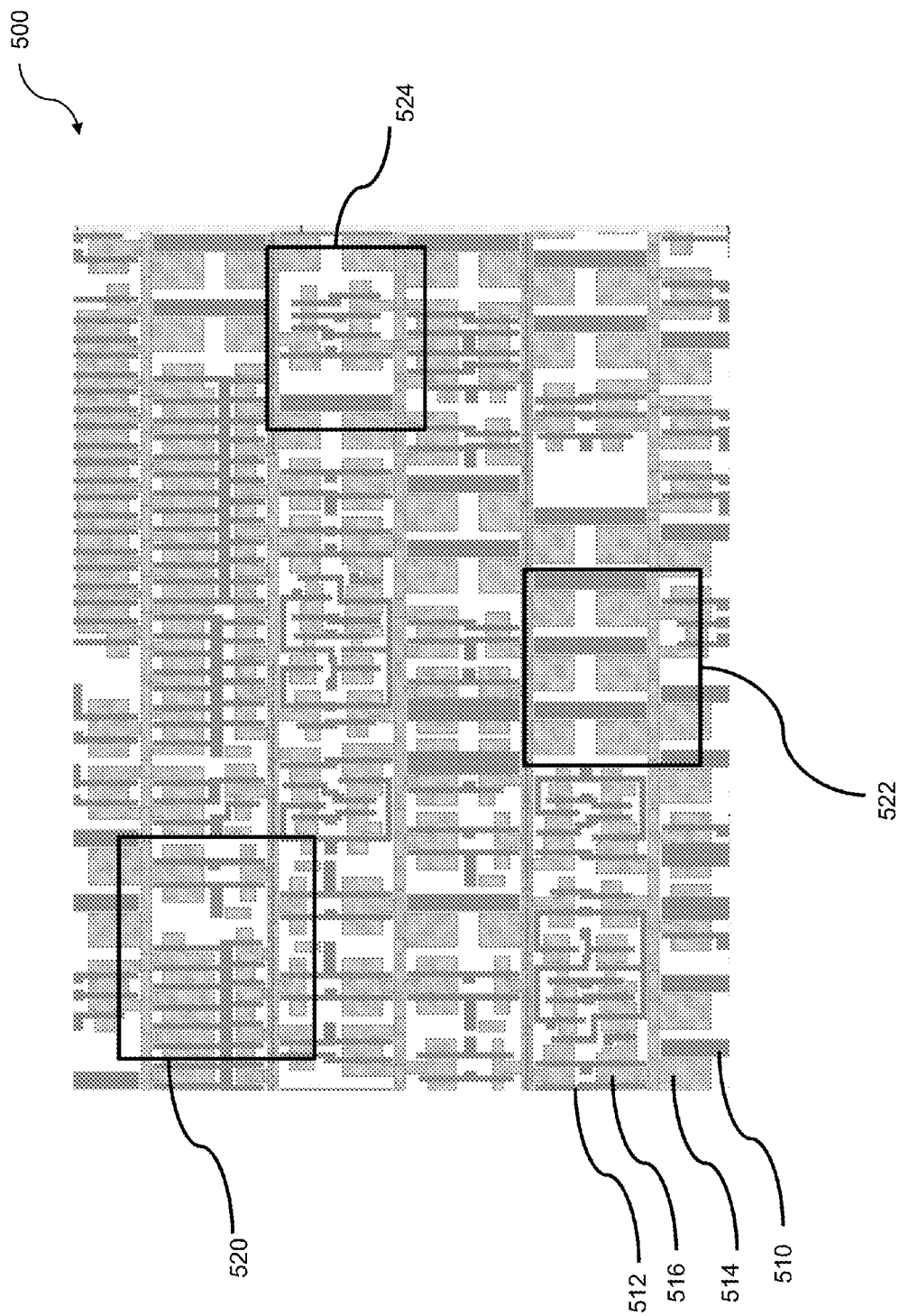
FIG. 5 is an example layout with identified areas of interest.

FIG. 5 is an example layout with identified areas of interest. The layout 500 includes variety of layers that may each include one or more geometric shapes defined for the layer. The shapes for one layer may represent various elements to be used in a step of the fabrication process, such as a lithographic process. A layer may or may not represent any physical elements in the final chip, depending on the layer's purpose in the specific fabrication process. Depending on the embodiment, the layout 500 may have any number of layers, but two different layers may be rendered in two different line types, stipple patterns, or colors. The various elements in a layer can take any shape, depending on the embodiment. A first layer is dark grey, and includes rectangle 510 and rectangle 512 as well as many other elements. A second layer is represented in a lighter grey, and includes rectangle 514 and irregular shape 516—which is partially occluded by rectangle 512—as well as many other elements.

Three areas of interest are shown for layout 500. A first area of interest 520, a second area of interest 522, and a third area of interest 524 may be selected by any method and for any reason, depending on the embodiment, but in some embodiments areas of interest are selected based on electrical failures on a physical chip. In at least one embodiment, a simulation can be used to generate potential defects that could cause the failure observed in the physical chip, and the areas of interest can then be selected to include the potential defects. In at least one embodiment, the areas of interest are selected using a mask view CAD navigation software.

Figure 6:
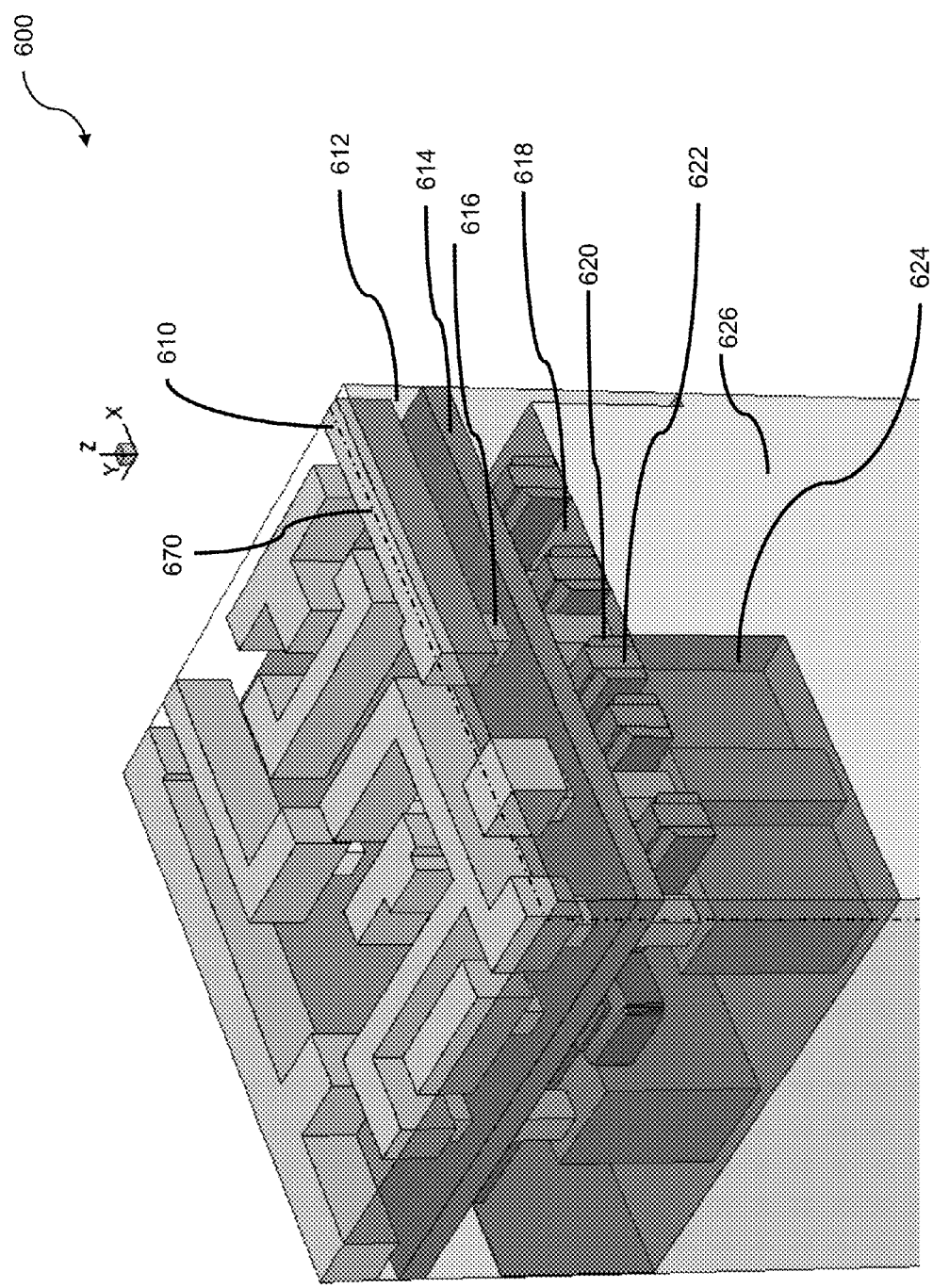
FIG. 6 is an example chip portion cross-section.

FIG. 6 is an example chip portion cross-section. The chip portion 600 may represent an area of interest and is rendered in three-dimensional as a perspective view. The chip portion 600 includes rendered three-dimensional structures on various layers, including a metal conductor 610, silicon dioxide 612—rendered mostly transparent—a low-k dielectric 614, a metal contact 616, more silicon dioxide 618—also rendered mostly transparent—a nitride spacer 620, a polysilicon line 622, a shallow trench isolation (STI) 624, and bulk silicon 626. The various structures may be generated using a three-dimensional simulator as described above; thus, the rendering may be based on a three-dimensional simulation that includes structural generation. The rendering may include generating two or more cuts on planes that intersect a surface of the chip and intersect two or more points within the semiconductor chip where the two or more cuts form adjacent edges of the three-dimensional view. The three-dimensional rendering of the chip portion 600 may include only some of the layers of the chip portion. For example, additional layers above the layer with the metal conductor 610 may be included in the layout, but are not rendered in order to allow various other structures to be more clearly seen.

The three-dimensional view is generated in real time in some embodiments. A user is able to interact with the three-dimensional view in real time in some embodiments. The interacting may include rotating the three-dimensional view, and/or zooming the three-dimensional view. The user is able to remove or include various layers, groups of structures, or individual structures interactively in some embodiments. The user may be able to define virtual cuts through the three-dimensional view. One view of a cut through the cross section at cut-plane 670 is shown in FIG. 7.

Figure 7:
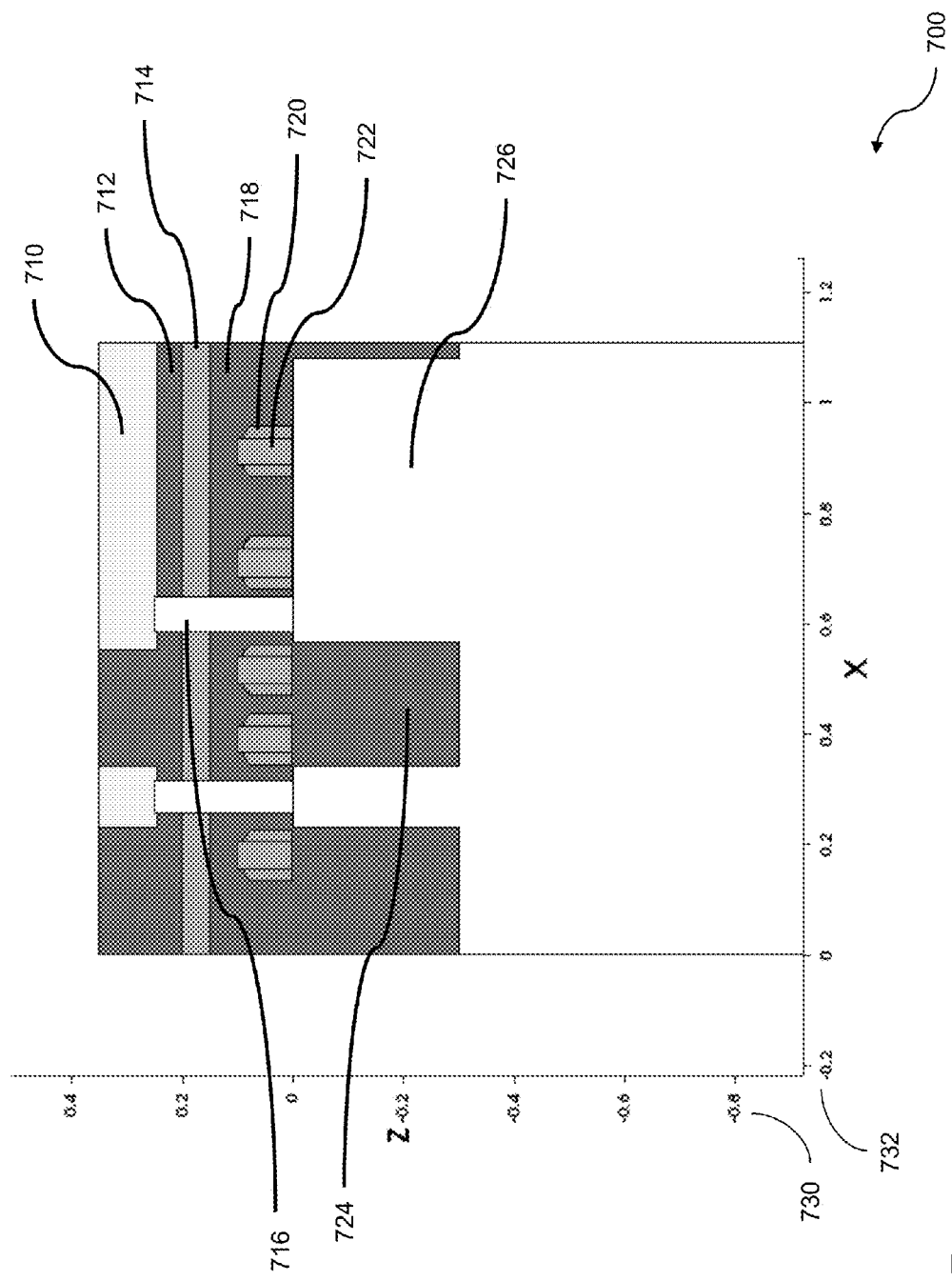
FIG. 7 is an example cut through a cross-section.

FIG. 7 is an example cut through a cross-section. The cut 700 is a two dimensional view of a cut through a cross-section of the portion of the chip, as generated by the three-dimensional simulation. The rendering can include generating a cut through the cross-section of the three-dimensional view. Depending on the embodiment, the cut plane, such as cut plane 670, may be positioned at any location or at angle through the cross-section. The example cut plane 670 is parallel to the X-Z plane, and perpendicular to the Y-axis, but some embodiments may allow a cut plane to be at an angle that is not parallel or perpendicular to one or more of the X, Y, and Z axes.

The cut 700 shows a cross section of the metal conductor 722, silicon dioxide 712, the low-k dielectric 714, the metal contact 716, silicon dioxide 718, the nitride spacer 720, the polysilicon line 722, the shallow trench isolation (STI) 724, and bulk silicon 626. The presentation of the cut 700 to the user may include calibrated axes, such as the Z-axis 730 and X-axis 732, which may include units of measure, such as microns, or nanometers, that may be useful for comparing to a micrograph of a cut of an actual chip. The rendered view of a simulated cut may be compared to a micrograph of a corresponding cut in a physical chip to identify a defect in the physical chip.

Figure 8:
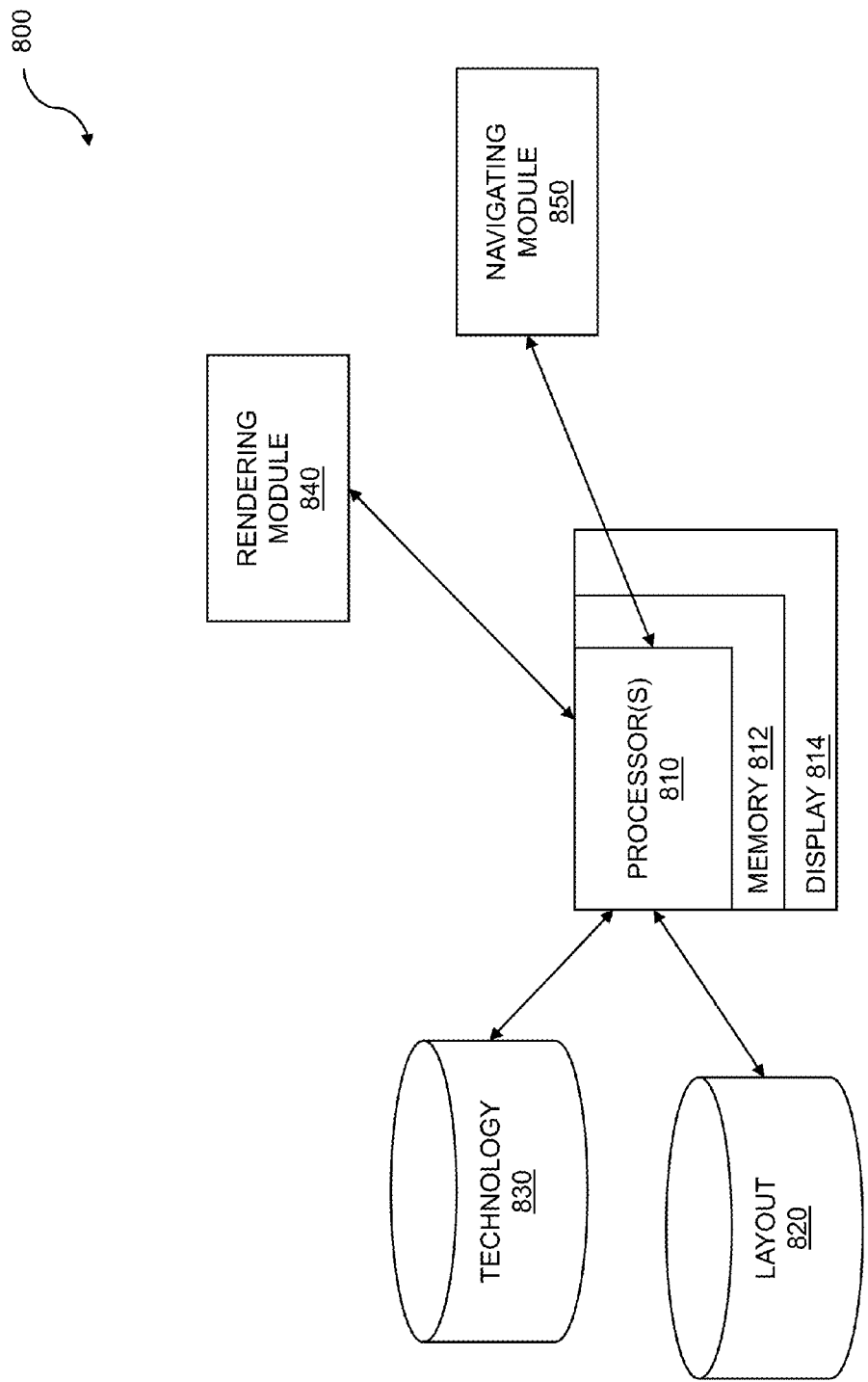
FIG. 8 is a system diagram for cross-section identification and rendering.

FIG. 8 is a system diagram for cross-section identification and rendering. The system 800 includes one or more processors 810 coupled to memory 812 which may be used to store computer code instructions and/or data. A display 814 may also be included which can be any electronic display, including but not limited to, a computer display, a laptop screen, a net-book screen, a tablet screen, a cell phone display, a mobile device display, a remote with a display, a television, a projector, or the like. A layout of a design 820 may be stored on a computer disk or another computer storage medium and may be obtained for analysis. A technology file 830 describing a semiconductor fabrication process used to manufacture a physical chip from the layout 820 also may be stored on a computer disk or other computer storage medium and may also be obtained. A rendering module 840 may be included that allows display of a three-dimensional view of the layout 820. A navigating module 850 may be included to allow movement of a failure analysis prober station over a physical chip to navigate to a specific portion of a physical chip which corresponds to a section of the layout 820. In some embodiments, the navigating module provides an area of interest for the rendering module to render, but in other embodiments, other software or a human operator may provide an area of interest to the rendering module 840 and the corresponding physical area of interest to the navigating module 850. In at least one embodiment functions of the rendering module 840 and the navigating module 850 are accomplished by the one or more processors 810.

The system 800 may include computer program product for circuit failure analysis comprising code for obtaining a layout for a semiconductor chip design; code for obtaining a technology file for a fabrication process on which the semiconductor chip design is fabricated to produce a physical chip; code for identifying a physical portion of the physical chip to be failure analyzed; code for rendering a three-dimensional view of a design portion of the semiconductor chip design based on the layout and the technology file wherein the design portion corresponds to the physical portion; and code for navigating to the physical portion of the physical chip, wherein the design portion was three-dimensionally rendered.

Each of the above methods may be executed on one or more processors on one or more computer systems. Embodiments may include various forms of distributed computing, client/server computing, and cloud based computing. Further, it will be understood that the depicted steps or boxes contained in this disclosure's flow charts are solely illustrative and explanatory. The steps may be modified, omitted, repeated, or re-ordered without departing from the scope of this disclosure. Further, each step may contain one or more sub-steps. While the foregoing drawings and description set forth functional aspects of the disclosed systems, no particular implementation or arrangement of software and/or hardware should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. The elements and combinations of elements in the block diagrams and flow diagrams, show functions, steps, or groups of steps of the methods, apparatus, systems, computer program products and/or computer-implemented methods. Any and all such functions—generally referred to herein as a "circuit," "module," or "system"—may be implemented by computer program instructions, by special-purpose hardware-based computer systems, by combinations of special purpose hardware and computer instructions, by combinations of general purpose hardware and computer instructions, and so on.

A programmable apparatus which executes any of the above mentioned computer program products or computer-implemented methods may include one or more microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are neither limited to conventional computer applications nor the programmable apparatus that run them. To illustrate: the embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized including but not limited to: a non-transitory computer readable medium for storage; an electronic, magnetic, optical, electromagnetic, infrared, or semiconductor computer readable storage medium or any suitable combination of the foregoing; a portable computer diskette; a hard disk; a random access memory (RAM); a read-only memory (ROM), an erasable programmable read-only memory (EPROM, Flash, MRAM, FeRAM, or phase change memory); an optical fiber; a portable compact disc; an optical storage device; a magnetic storage device; or any suitable combination of the foregoing. In the context of this document, a computer readable storage medium may be any tangible medium that can contain or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed approximately simultaneously to enhance utilization of the processor and to facilitate substantially simultaneous functions. By way of implementation, any and all methods, program codes, program instructions, and the like described herein may be implemented in one or more threads which may in turn spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the causal entity.

While the invention has been disclosed in connection with preferred embodiments shown and described in detail, various modifications and improvements thereon will become apparent to those skilled in the art. Accordingly, the forgoing examples should not limit the spirit and scope of the present invention; rather it should be understood in the broadest sense allowable by law.

What is claimed is:

1. A computer program product embodied in a non-transitory computer readable medium for circuit failure analysis comprising:
   code for identifying a physical portion of a physical chip based on a semiconductor chip design corresponding to the physical chip to be failure analyzed;
   code for rendering a three-dimensional view of the physical portion that was identified, wherein the rendering includes generating two or more cuts on planes that intersect a surface of the semiconductor chip and intersect two or more points within the semiconductor chip where the two or more cuts form adjacent edges of the three-dimensional view; and
   code for navigating to the physical portion of the physical chip.

2. The computer program product of claim 1 further comprising code for obtaining a layout for a semiconductor chip design corresponding to the physical chip.

3. The computer program product of claim 2 further comprising code for converting the layout into a mask view for the semiconductor chip design.

4. The computer program product of claim 2 further comprising code for evaluating a surface of the physical chip for matching with the layout.

5. The computer program product of claim 1 further comprising code for identifying a failing section of the physical chip where the failing section includes the physical portion.

6. A computer system for circuit failure analysis comprising:
   a memory which stores instructions;
   one or more processors coupled to the memory wherein the one or more processors are configured to:
      identify a physical portion of a physical chip based on a layout for a semiconductor chip design corresponding to the physical chip to be failure analyzed;
      render a three-dimensional view of the physical portion that was identified, wherein the rendering includes generating two or more cuts on planes that intersect a surface of the semiconductor chip and intersect two or more points within the semiconductor chip where the two or more cuts form adjacent edges of the three-dimensional view; and
      navigate to the physical portion of the physical chip.

7. A computer-implemented method for circuit failure analysis comprising:
   identifying a physical portion of a physical chip based on a layout for a semiconductor chip design corresponding to the physical chip to be failure analyzed;
   rendering, one or more processors, a three-dimensional view of the physical portion that was identified, wherein the rendering includes generating two or more cuts on planes that intersect a surface of the semiconductor chip and intersect two or more points within the semiconductor chip where the two or more cuts form adjacent edges of the three-dimensional view; and
   navigating to the physical portion of the physical chip.

8. The computer system of claim 6 further configured to convert the layout into a mask view for the semiconductor chip design.

9. The computer system of claim 6 further configured to evaluate a surface of the physical chip for matching with the layout.

10. The computer system of claim 6 further configured to identify a failing section of the physical chip where the failing section includes the physical portion.

11. The computer-implemented method of claim 7 wherein the identifying the physical portion is based on electrically analyzing the physical chip.

12. The computer-implemented method of claim 11 wherein the electrically analyzing identifies a failure in operation.

13. The computer-implemented method of claim 12 further comprising analyzing the failure with imaging of the physical chip.

14. The computer-implemented method of claim 7 further comprising obtaining a layout for the semiconductor chip design corresponding to the physical chip.

15. The computer-implemented method of claim 14 further comprising obtaining a technology file for a fabrication process on which the semiconductor chip design is fabricated to produce the physical chip.

16. The computer-implemented method of claim 15 further comprising converting the layout into a mask view for the semiconductor chip design.

17. The computer-implemented method of claim 15 further comprising selecting areas of interest on the layout of the semiconductor chip design.

18. The computer-implemented method of claim 17 wherein the areas of interest are based on an electrical analysis of the physical chip.

19. The computer-implemented method of claim 18 wherein the areas of interest are generated based on scoring of circuitry.

20. The computer-implemented method of claim 15 further comprising evaluating a surface of the physical chip for matching with the layout.

21. The computer-implemented method of claim 7 wherein the rendering is based on a three-dimensional simulation that includes structural generation.

22. The computer-implemented method of claim 7 wherein the three-dimensional view is generated in real time.

23. The computer-implemented method of claim 7 further comprising rotating the three-dimensional view.

24. The computer-implemented method of claim 7 further comprising zooming of the three-dimensional view.

25. The computer-implemented method of claim 7 wherein the rendering includes generating a cut through a cross section of the three-dimensional view.

26. The computer-implemented method of claim 7 wherein the navigating is accomplished using layout-driven chip navigation software.

27. The computer-implemented method of claim 7 wherein the navigating further comprises moving a probing location to the physical portion of the physical chip, and wherein the navigating further comprises analyzing a plurality of layout levels within the layout to determine target points on the layout; identifying those target points on the physical chip; and determining a relative location of the physical portion to one or more of the target points.

28. The computer-implemented method of claim 7 further comprising determining sampling of failing parts based on failure analysis using the rendering.

29. The computer-implemented method of claim 7 further comprising identifying a failing section of the physical chip where the failing section includes the physical portion.

30. The computer-implemented method of claim 7 further comprising detecting a defect in an image of the physical chip in the physical portion.

31. The computer-implemented method of claim 30 wherein the image is based on optical imaging, electron beam imaging, or focused ion beam imaging and further comprising code for correlating the defect in the image with an electrical analysis for a net-list of a design for the physical chip with a defect inserted.

* * * * *